United States Patent [19]

Engel et al.

[11] Patent Number: 4,902,926
[45] Date of Patent: Feb. 20, 1990

[54] PIEZOELECTRIC MEASURING ELEMENT

[75] Inventors: Günter Engel, Leitring; Peter W. Krempl, Graz/Ragnitz; Helmut List, Graz, all of Austria

[73] Assignee: AVL Gesellschaft für Verbhrennungskraftmaschinen und Messtechnik m.b.H. Prof. Dr. Dr. h.c. Hans List, Graz, Austria

[21] Appl. No.: 269,594

[22] Filed: Nov. 10, 1988

[30] Foreign Application Priority Data

Nov. 19, 1987 [AT] Austria ............................ 3057/87

[51] Int. Cl.⁴ .............................................. H01L 41/08
[52] U.S. Cl. ........................... 310/361; 310/338; 310/329; 310/360
[58] Field of Search ............... 310/360, 361, 328, 329, 310/338, 334; 73/514 R, 516 R

[56] References Cited

U.S. PATENT DOCUMENTS

| | | | |
|---|---|---|---|
| 2,410,825 | 11/1946 | Lane | 310/361 X |
| 4,344,010 | 8/1982 | Vig et al. | 310/361 |
| 4,365,182 | 12/1982 | Ballato et al. | 310/361 |
| 4,410,822 | 10/1983 | Filler | 310/361 X |
| 4,568,850 | 2/1986 | Ballato | 310/361 |
| 4,604,544 | 8/1986 | Konomi et al. | 310/338 |
| 4,667,127 | 5/1987 | Krempl et al. | 310/338 |

FOREIGN PATENT DOCUMENTS 271947 6/1969 Austria .
382968 5/1987 Austria .

*Primary Examiner*—Mark O. Budd
*Attorney, Agent, or Firm*—Watson, Cole, Grindle & Watson

[57] ABSTRACT

In piecoelectric measuring elements comprising two or more crystal elements that are jointly subject to the mechanical variable to be measured and are provided with electrically conductive electrodes on opposite surfaces located essentially normal to the electric (x) axes of these crystal elements, disadvantages arising from shearing stresses can be prevented by using crystal elements (2) from crystals of point group 32, in which exist two opposite types of enantiomorphism, l and r, in which part of the crystal elements used belong to one of the two enantiomorphic types l or r, and have one of the two absolute orientations of the x-axis, $\alpha_1$ or $\alpha_2$, while the remaining crystal elements belong to the opposite enantiomorphic type and have the opposite orientation of the x-axis.

10 Claims, 1 Drawing Sheet

PIEZOELECTRIC MEASURING ELEMENT

BACKGROUND OF THE INVENTION

This invention relates to a piezoelectric measuring element, especially for use in transducers, comprising two or more crystal elements made from crystals of point group 32, in which opposite enantiomorphic types l and r exist, the crystal elements being jointly subject to the mechanical variable to be measured, such as force, pressure of acceleration, and carrying electrically conductive electrodes on surfaces that are located opposite of each other and are essentially normal to the electric (x) axes of these crystal elements.

DESCRIPTION OF THE PRIOR ART

Piezoelectric measuring elements composed of crystal elements may utilize either the longitudinal or the transversal piezo effect. Such measuring elements consist of several crystal elements stacked one on top of the other to form a layered body, between which are provided electrodes for conducting electrical charges, electrodes of the same charge being conductively connected.

A measuring element of the above type is described in Austrian Patent No. 271 947, for instance, where the disk-shaped single-crystal elements are arranged in the measuring element such that their optical (z) axes are parallel to each other. When the measuring element heats up this arrangement will ensure that the expansion coefficients of the individual disks are identical in all directions, and strains at the interfaces between the disks are avoided. In this instance force is applied parallel to the electric (x) axis, and piezoelectric sensitivity is described by the piezo modulus $d_{11}$. For the conduction of electrical charges the electrodes on either side of the individual disks are provided with tongues passing through bores in the single crystal and extending to the other side where they are turned over, fitting into a recess of the electrode of the adjacent crystal element, at the distance required for insulating purposes. Although the parallel z-axes help to minimize the forces arising at the interfaces between the crystal elements if the measuring element is heated, due to the different expansion coefficients of the crystal elements in the y and z directions, they will not prevent undesirable charges resulting from mechanical shear stresses in the measuring element due to the piezoelectric shearing effect (piezo coefficient $d_{14}$).

In the measuring element described in Austrian Patent No. 382 968 the problem of charge collection and conduction from the measuring elements is solved in the following way. The electrodes of the individual single-crystal elements are grouped in pairs, with bridges connecting electrodes of the same charge applied on the outside of the crystal stack. In the vicinity of these connecting bridges adjacent electrodes of opposite charges belonging to two neighbouring crystal elements are provided with recesses. The connecting bridges between the individual electrodes of the same charge are vapour-deposited onto the side of the crystal stack. If the optical (z) axis forms an angle $\leq 40°$ together with the plane defined by the connecting bridges applied opposite of each other on the stack, it is possible to eliminate most of the interfering signals that may be caused by transversal piezo effects upon the occurrence of forces normal to the x-axis. Once again, however, it is impossible to prevent the charges resulting from unintended though inevitable shear stresses in the measuring element via the piezoelectric shearing effect, which cannot be avoided by any of the measures described in the above publication.

Similar effects are observed in transducers utilizing the transversal piezoelectric effect. As with the longitudinal effect electric polarization takes place parallel to the x-axis. The main difference is in the application of force, which is performed parallel to the y-axis in order to utilize the transversal piezo effect. Since an application of force parallel in the z-axis will not cause any dielectric displacement, i.e., the crystal is insensitive to force effects parallel to the optical axis, it is advisable for utilization of the transversal piezo effect that force be applied as parallel as possible to the y-axis of the crystal. If several crystal rods or elements are used in a transducer based on the transversal piezo effect, great emphasis must be placed on appropriate orientation of the y-axis and the z-axis for the above reasons. Again, uncompensated shear stresses will occur in the x-y plane, which may lead to errors of measurement.

SUMMARY OF THE INVENTION

It is an object of this invention to propose a measuring element of the above kind, in which the influence of faulty charges arising from the piezoelectric shearing effect can be minimized in spite of its simplicity of design, while the sensitivity to noise resulting from thermal and mechanical loads remains low.

In the invention this is achieved by providing that part of the crystal elements belonging to a certain enantiomorphic type l or r and have one of the two absolute orientations of the x-axis, $\alpha_1$ or $\alpha_2$, and that the remaining crystal elements belong to the opposite enantiomorphic type and have the opposite absolute orientation of the x-axis. In this way the influence of the above-mentioned charges arising from the shearing effect may be eliminated to an extent unprecendented, despite a coefficient $d_{14}$ deviating from zero in the piezo matrix of crystals of point group 32.

The term "enantiomorphism" is common in crystallography and implies that some crystals of point group 32, such as $\alpha$ quartz and its homeotypes, can crystallize in two possible space groups, i.e., P3$_2$21 and P3121. The two forms, which, in the instance of quartz, are known as "Brazilian twins", differ with regard to the orientation of the rotation of the polarization plane of light, for example, and are therefore termed l for left-handed rotation and r for right-handed rotation. The two possible absolute orientations of the x-axis, $\alpha_1$ and $\alpha_2$, will lead to the Dauphinee type twins in quartz known from crystallography. In this context consistent labelling of the axes is of importance. In this publication the positive x-direction of a right-hand crystal is determined and labelled as +x-axis such that in the instance of a positive shear a positive charge is given off. Starting from this the labelling of the other axes and signs is derived.

Table 1 below indicates the polarities of the charges given off in the +x-direction for the longitudinal piezo effect ($d_{11}$) and the piezoelectric shearing effect ($d_{14}$).

TABLE 1

| Polarity of charge given off in the +x-direction | | | | |
|---|---|---|---|---|
| enantiomorphism | absolute orientation of x-axis | $d_{11}$ | $d_{14}$ | variant |
| r (right-hand) | $\alpha_1$ | + | + | I |
| | $\alpha_2$ | − | + | II |
| | $\alpha_1$ | − | − | II |

TABLE 1-continued

| | Polarity of charge given off in the +x-direction | | | |
|---|---|---|---|---|
| enantiomorphism | absolute orientation of x-axis | $d_{11}$ | $d_{14}$ | variant |
| l (left-hand) | $\alpha_2$ | + | − | I |

As is indicated in Table 1 r $\alpha_1$ and l $\alpha_2$ crystal elements may be combined in a first variant, and r $\alpha_2$ and l $\alpha_1$ crystal elements in a second variant. By proper selection of the outer dimensions, for instance, the thickness of the individual crystal elements and the size of the electrode surfaces attached to the surfaces essentially normal to the electric axes, the charges caused by the shearing effect can be fully compensated.

For the majority of applications, however, all crystal elements of a measuring element are configured alike with regard to dimensions and electrode surfaces, and the proposal is put forward in a variant of the invention that the crystal elements should belong to opposite enantiomorphic types, i.e., half of them should be l and the other half r, and that they should be given opposite absolute directions of the x-axes, $\alpha_1$ and $\alpha_2$.

For optimum compensation of shear stresses distributed inhomogeneously over the stack of crystal elements, a further development of the invention provides that two adjacent crystal elements belong to opposite enantiomorphic types l and r, and that they have opposite absolute directions of the x-axes, $\alpha_1$ and $\alpha_2$, each pair of crystal elements consisting of an l$\alpha_2$ and an r$\alpha_1$ type.

The basic idea of this invention permits utilization both of the longitudinal and of the transversal effect, provided that, for the longitudinal effect, the variable to be measured $T_1$ is applied parallel to the x-axis in part— preferably half—of the crystal elements of the measuring element, and antiparallel to the x-axis in the rest of the crystal elements, or rather, that, for the transversal effect, the optical z-axes are aligned in the measuring element (l) so as to be parallel to each other, and the variable to be measured $T_z$ is applied in a direction normal to the plane of the individual crystal elements of the measuring element defined by the x and z axes. If the measuring element is used in an environment with small temperature differences, in which differences in the expansion coefficients of the crystal elements in the individual directions of the axes may be neglected, the z axes of the crystal elements may have arbitrary directions when the longitudinal piezo effect is utilized.

In order to improve signal quality and the signal-to-noise ratio, the invention may provide that several partial stacks of two or more crystal elements be combined into a unit.

In order to facilitate the conduction of charge and the application of bridges connecting identically charged electrodes a further development of the invention provides that a measuring element utilizing the transversal piezo effect be composed of at least three partial stacks arranged in a circle around an axis parallel to the variable to be measured $T_2$, the x-axes of the individual crystal elements being aligned parallel or anti-parallel to the radius of the measuring element, and the z-axes of the partial stacks being aligned parallel to each other.

Crystal elements differing with regard to their space group or enantiomorphism as well as to the absolute orientation of the x-axes, cannot be cut from one raw crystal bar. It is all the more important therefore that the individual crystal elements have the same physical properties. The invention proposes that each of the crystal elements be taken in its entirety from a given growth zone of one raw crystal bar and that it be free from zone boundaries. Typically, the growth of crystals, for instanve of synthetic quartz crystals, is characterized by the development of growth zones, denoted as X, S, Z. These zones are made visible by techniques such as heat treatment, irradiation with hard X-rays, or X-ray topography.

The latter method also reveals that the boundaries between the individual growth zones are marked by a higher density of dislocation lines. These crystal defects often lead to fracturing or cracking, especially in transducers in which the crystal elements are subject to comparatively high thermal and mechanical loads. The avoidance of zone boundaries in the individual crystal elements of a measuring element will thus bring forth the improvements demanded above.

Because of the different growth rates of the individual zones it is the +x and the Z zones that are of major interest in quartz, the Z zones usually being larger than the +x zones on account of their higher growth rate, which makes them preferable for the production of crystal elements.

If $GaPO_4$ is used, preference is given to R zones, whose growth surface is rhombohedral.

Finally, it is provided in an improved variant of the invention that crystal elements of the same enantiomorphic type and the same absolute orientation be cut from one and the same raw crystal bar.

BRIEF DESCRIPTION OF THE DRAWINGS

Following is a more detailed description of the invention as illustrated by the accompanying drawing in which.

DETAILED DESCRIPTION OF THE PREFERRED EMBODIMENTS

Figure 1:
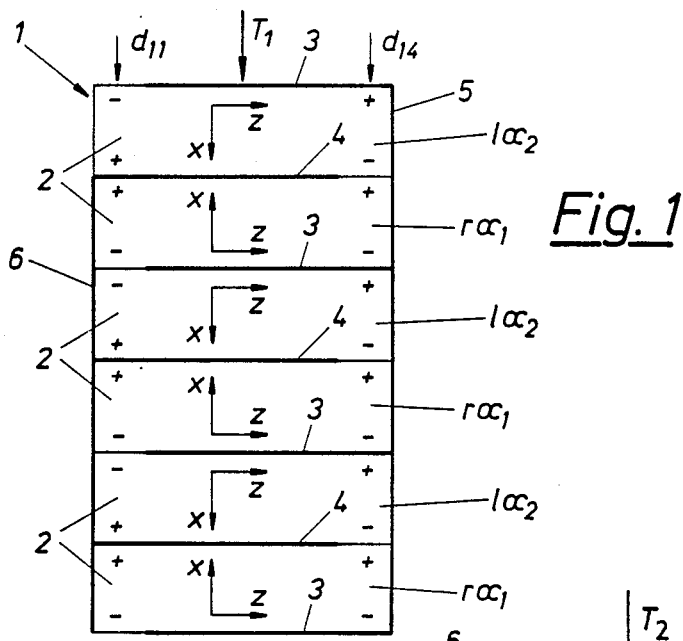
FIG. 1 is a sectional presentation of a measuring element according to the invention, FIG. 2 a section of another variant of a measuring element along line II—II in FIG. 3.

In order to prevent undesirable charges due to shear stresses in a measuring element 1 utilizing the longitudinal piezo effect, the disk-shaped crystal element 2 shown in FIG. 1 are stacked such that adjacent crystal elements 2 belong to opposite enantiomorphic types l and r (for example, left-handed and right-handed quartz) and different absolute orientations of the x-axis (Dauphinee types), $\alpha_1$ and $\alpha_2$. In addition to the first variant shown in FIG. 1 (cf. Table 1), in which l$\alpha_2$ types are followed by r$\alpha_1$ types and vice versa, a second variant, which is not shown here, is possible of course, in which pairs of the types l$\alpha_1$ and r$\alpha_2$ are combined. The variable to be measured $T_1$ is applied in a direction parallel or anti-parallel to the positive x-directions of the individual crystal elements.

Opposite faces of the crystal elemnents 2 are provided with electrodes 3, 4 which are attached to the crystal element by known methods, such as evaporation techniques. The connecting bridges 5 and 6 connecting identically charged electrodes 3 and 4 are positioned on opposite outer faces of the measuring element 1. Further details of the electrode arrangement are contained in the publication Austrian Patent No. 382 968 mentioned before.

On the left-hand side of the measuring element 1 the polarities of the charges on which the longitudinal piezo effect ($d_{11}$) is based, are indicated, on the right-hand side those connected with the piezoelectric shearing effect ($d_{14}$). As is seen, the charges on the right-hand side compensate each other both for the positive electrode 6 and for the negative electrode 5 in case of an even number of crystal elements 2; in this context Table 1 is referred to, which contains the polarities of the charges given off in the +x-direction. As opposed to the arrangement presented in FIG. 1, the Z axes of the crystal elements 2 need not be aligned parallel to each other.

Figure 2:
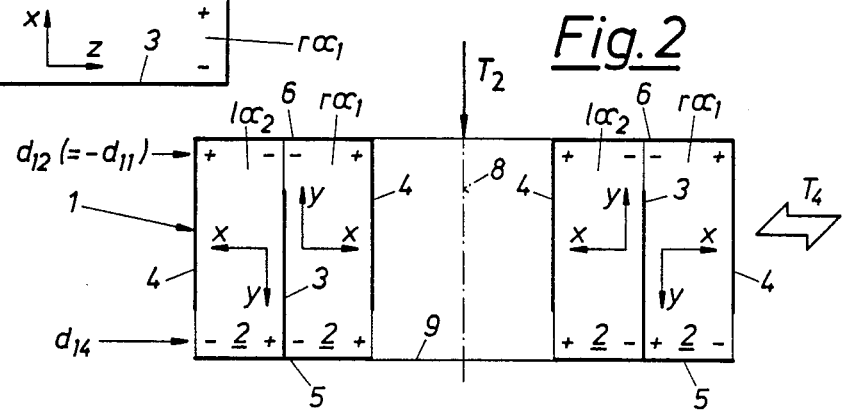
Figure 3:
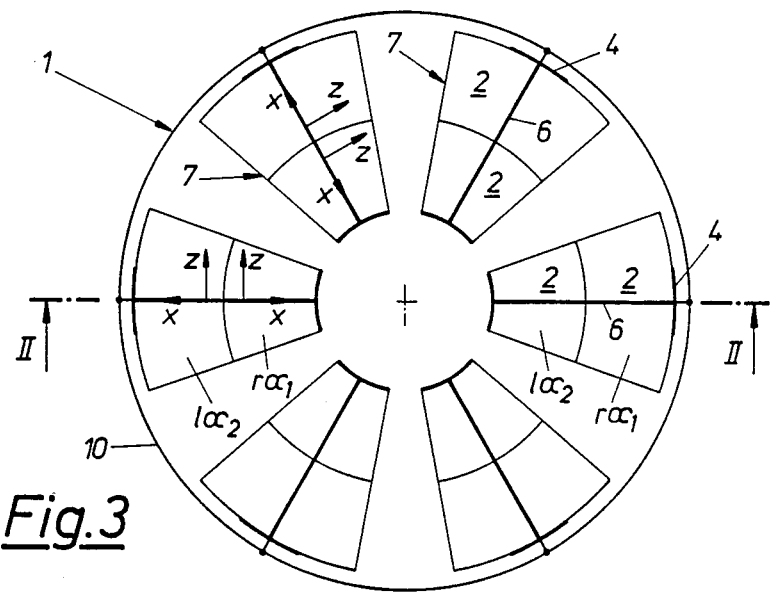
FIG. 3 is a view from above of the measuring element according to FIG. 2.

In FIGS. 2 and 3 a measuring element 1 is presented which utilizes the transversal piezo effect and comprises a total of six partial stacks 7 of two crystal elements 2 each. The individual partial stacks 7 are positioned in a circle around an axis 8 parallel to the variable to be measured $T_2$, the x-axes of the individual crystal elements running parallel or anti-parallel to the radius of the measuring element 1. The individual partial stacks 7 contain $l\alpha_2$ and $r\alpha_1$ crystal elements arranged in pairs. The connecting bridges 5 carrying the negative charges are united by the electrical line 9 shown in FIG. 2, and the connecting bridges 6 carrying the positive charges by a loop 10 presented in FIG. 3. Here the shear stress $T_4$ in the x-y crystal plane is compensated, while the piezo coefficient $d_{12}$ is used for measurement.

If the crystal elements have different outer dimensions, or if the shear stresses are distributed over the stack inhomogeneously, the basic idea of the invention will facilitate compensation of the charges produced by the shearing effect, assisted by the selection of electrode surfaces of different sizes.

We claim:

1. A piezoelectric measuring element for use in transducers, comprising two or more crystal elements from crystals of point group 32, said crystal elements existing in opposite enantiomorphic types l and r, and being jointly subject to a mechanical variable to be measured, belonging to the group of force, pressure and acceleration, said crystal elements carrying electrically conductive electrodes on surfaces that are located opposite of each other and are essentially normal to electric (x) axes of said crystal elements, wherein said measuring element consists of a first and a second group of crystal elements, each of said first and second group comprises at least one crystal element, and wherein said crystal elements of said first and second group belong to opposite enantiomorphic types l and r and have opposite absolute orientations $\alpha_1$ and $\alpha_2$ of said x-axis.

2. A piezoelectric measuring element according to claim 1, wherein half of said crystal elements belong to said first group and half to said second group.

3. A piezoelectric element according to claim 1 or 2, wherein one of two adjacent crystal elements belong to said first group and the other to said second group, so that each pair of said crystal elements consisting of an $l\alpha_2$ and an $r\alpha_1$ type or an $r\alpha_2$ and an $l\alpha_1$ type.

4. A piezoelectric measuring element according to claim 1, wherein in said first group of crystal elements a variable $T_1$ to be measured is applied parallel to said x-axis of said crytal elements and anti-parallel to said x-axis in said second group of crystal elements.

5. A piezoelectric measuring element according to claim 1, wherein optical z-axes of said crystal elements are aligned in said measuring element so as to be parallel to each other, and wherein a variable $T_2$ to be measured is applied in a direction normal to a plane defined by said x- and z-axes of said crystal element of said measuring element.

6. A piezoelectric measuring element according to claim 4, wherein several partial stacks of two or more of said crystal elements are combined into a unit.

7. A piezoelectric measuring element according to claim 5, wherein several partial stacks of two or more of said crystal elements are combined into a unit.

8. A piezoelectric measuring element according to claim 7, comprising at least three partial stacks arranged in a circle around an axis parallel to said variable $T_2$ to be measured, wherein said x-axes of said crystal elements being aligned parallel or anti-parallel to the radius of said measuring element and said z-axes being aligned parallel to each other.

9. A piezoelectric measuring element according to claim 1, wherein each of said crystal elements is taken from a given growth zone of one raw crystal bar and is free from zone boundaries.

10. A piezoelectric measuring element according to claim 9, wherein said crystal elements of the same enantiomorphic type and the same absolute orientation are cut from one raw crystal bar.

* * * * *